United States Patent
Sung et al.

(10) Patent No.: US 6,773,760 B1
(45) Date of Patent: Aug. 10, 2004

(54) METHOD FOR METALLIZING SURFACES OF SUBSTRATES

(75) Inventors: Yuh Sung, 7Fl., No. 72, Lane 165, Yuanhua Rd., Jungli City Taoyuan (TW), 320; Ming-Der Ger, 2Fl., No. 65, Tsan 6th Tsuen, Dashi Jen, Taoyuan (TW), 335; Yu-Hsien Chou, Tainan (TW); Bing-Joe Hwang, Taipei (TW)

(73) Assignees: Yuh Sung, Taoyuan (TW); Ming-Der Ger, Taoyuan (TW)

( * ) Notice: Subject to any disclaimer, the term of this patent is extended or adjusted under 35 U.S.C. 154(b) by 0 days.

(21) Appl. No.: 10/423,935

(22) Filed: Apr. 28, 2003

(51) Int. Cl.[7] ............................. B05D 3/10; B05D 1/18

(52) U.S. Cl. ..................... 427/437; 427/304; 427/305; 427/307; 427/436; 427/438

(58) Field of Search .............................. 427/430.1, 304, 427/305, 307, 436, 437, 438

(56) References Cited

U.S. PATENT DOCUMENTS

| | | | | |
|---|---|---|---|---|
| 4,004,051 A | * | 1/1977 | Kadison et al. | 427/304 |
| 4,406,250 A | * | 9/1983 | Araki et al. | 118/690 |
| 4,650,691 A | * | 3/1987 | Kinoshita et al. | 427/8 |
| 5,017,638 A | * | 5/1991 | Handa et al. | 524/449 |
| 5,182,131 A | * | 1/1993 | Hashimoto et al. | 427/8 |

* cited by examiner

Primary Examiner—Michael Barr
(74) Attorney, Agent, or Firm—Bacon & Thomas, PLLC

(57) ABSTRACT

A method for metallizing a surface of substrates is disclosed. Particularly, nonhomogeneous heating deposition occurs by setting the surface and the heater in an electroless plating reactor at different temperatures. Moreover, an adjustable gap is defined between the substrate being metalized and heating source board. The deposit can securely adhere to the surface of the substrate for gap creates and activates metallic nanoparticles, which possess higher activity and bonding strength to the surface. Accordingly, metallization of the surface of the substrate can be easily achieved without using precious metals and carcinogenic materials.

20 Claims, 1 Drawing Sheet

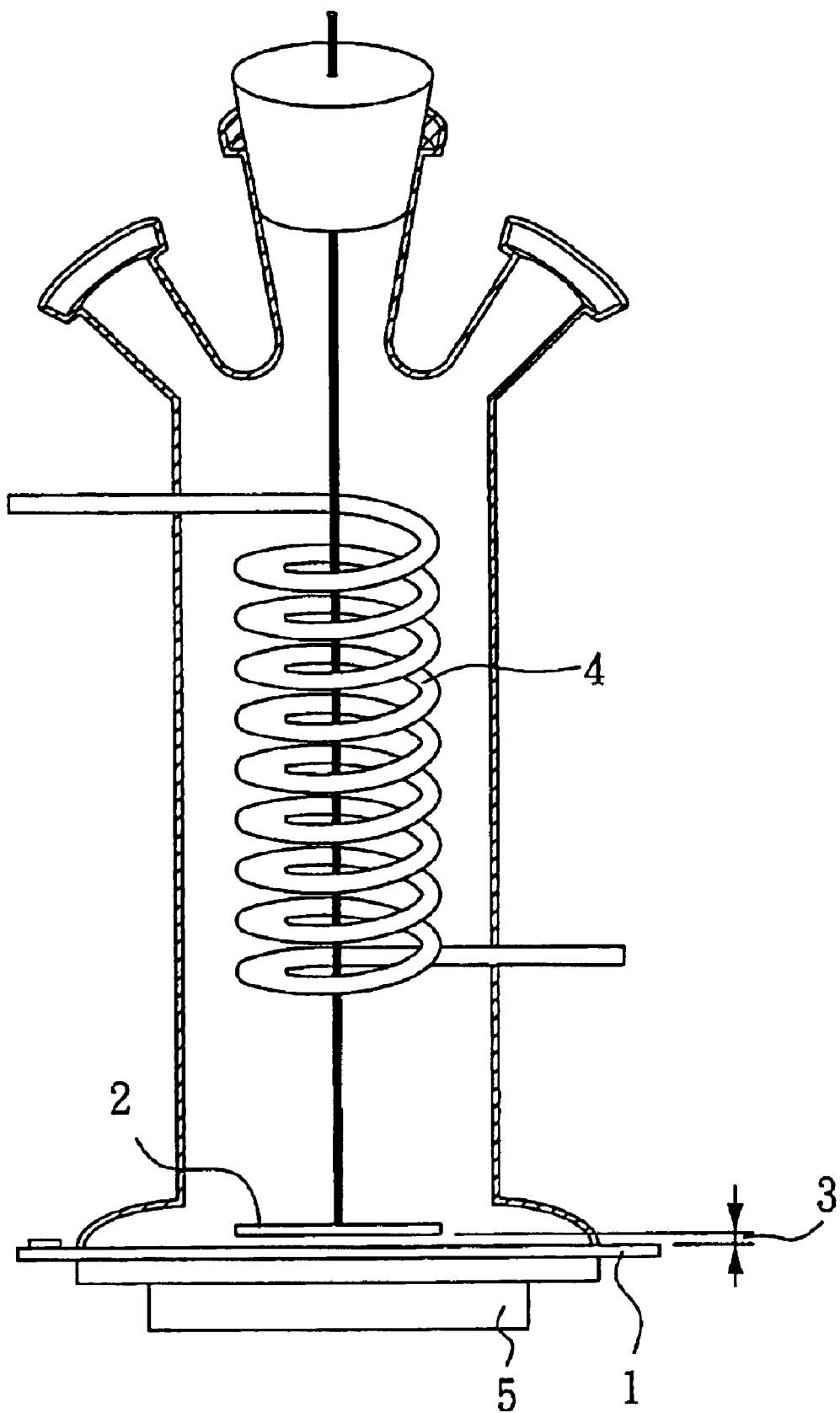

METHOD FOR METALLIZING SURFACES OF SUBSTRATES

BACKGROUND OF THE INVENTION

1. Field of the Invention

The present invention relates to a method for metallizing a surface and/or depositing metallic dots on a substrate, and particularly to a method. for metallizing a surface and/or depositing metallic dots on a substrate in which the surface can be electrically conductive or nonconductive.

2. Related Prior Art

Metallizing surfaces of substrates and/or depositing metallic dots on some substrates are significant in many industries and scientific technology, particularly in the manufacturing of printed circuit boards (PCBs), integrated circuits (ICs), Random Access Memory (RAM), chemical sensors, magnetic records and catalysts. In order to obtain plated films or dots with good adhesion as well as fine and tiny patterns on the nonconductive or semiconductive surfaces, proper pre-treatments before chemical plating (or electroless plating) are required. Especially, the metallic dots and/or dot arrays are difficult to be deposited or formed on a substrate without using photo-resisting pattern which is created by photolithography or other high-tech ways.

Patents including DE 38 06 884 C1, DE 39 23 832 A1, DE 39 31 003 A1, EP 02 06 133 A1 and EP 04 13 109 A2 mentioned some methods for forming a thin film of conductive polymers on the surfaces. However, the polymers may also deposited on the metal originally existing on the surface, which will results in poor adhesion between the metal plating later and the originally existing electrical contacts.

Patents including DE 39 39 676 C1, DE 41 12 462 A1, DE 42 27 836 A1 and GB 22 43 833 A provide solutions for the above problem, in which oxidants or acids are preliminarily added and adsorbed on the nonconductive surfaces. Unfortunately, applying such methods to semiconductor or ceramic substrates still does not produce with certainty the desired results. Moreover, the oxidants and acids are usually harmful to humans and so the health and safety of operators in the manufacturing process are put at risk.

U.S. Pat. Nos. 4,631,117, and 4,874,477 provide another solution by using conductive carbon black. However, the carbon black may be suitable for plated-through-hole technology (PTH) of PCBs, but not for the substrates with nonconducting surfaces and large areas.

U.S. Pat. Nos. 3,099,608, 3,099,608, 4,790,913 and No. 4,891,069 mentioned a pre-treatment procedure of activation in which Sn/Pd colloid solutions are added. A common disadvantage of using this method is that the operation conditions are strictly limited and thus the method cannot easily be applied to industries.

In U.S. Pat. Nos. 3,984,290, 4,895,739 4,952,286 5,007, 990 5,017,742 and 4,810,333, depositing metal with higher reduction potential than copper, for example, the platinum group, on the substrates and etching are used. However, the operation conditions are also strictly limited.

However, all of the methods aforementioned are very complex and expensive, particularly due to the use of precious metals. Therefore, it is desirable to provide an improved method for metallizing surfaces of the substrates to mitigate and/or obviate the aforementioned problems.

SUMMARY OF THE INVENTION

The present invention iprovides a method for metallizing a surface and/or depositing metallic dots on a substrate, which can be completed by simple procedures.

The present invention also provides a method for metallizing a surface of a substrate, which can be completed without using precious metals and carcinogenic materials.

In The method of the present invention primarily includes steps of: a) pre-treating the surface of the substrate; b) positioning the substrate in an electroless plating reactor in which a heat source and an electrolyte are set at different temperatures, the substrate and the heat source forming a gap of 0.1 to 1000 $\mu$m; and c) plating the substrate for a presetting duration.

The electrolyte may contain ions of Fe, Co, Ni, Cu, Ag, Au, Sn, Pt, Pd, etc., and particularly $Ni^{2+}$ or $Cu^{2+}$. The electrolyte is usually controlled at pH 3–13, and preferably at pH 4–9 or pH 12–13.

The substrate can be pre-treated by one or more procedures, for example, swelling, degreasing, coarsening, activation and washing.

The substrate and the heat source are usually separated at a gap of 0.1–1,000 $\mu$m, and preferably 30–500 $\mu$m. The substrate is preferably above the heat source.

The heat source is usually controlled at 50–200° C., and preferably at 70–150° C. The electrolyte is usually controlled at 10–80° C., and preferably at 10–50° C. In general, the heat source and the electrolyte can have a temperature difference ranging from 20° C. to 120° C., and preferably from 40° C. to 100° C.

The presetting duration for metallizing the substrate is usually between 10 seconds and 120 minutes, and preferably 1 minute to 90 minutes. The duration for depositing metallic dots or dot array is usually 10–1000 seconds, and preferably 30–800 seconds.

Other objects, advantages, and novel features of the invention will become more apparent from the following detailed description when taken in conjunction with the accompanying drawing.

BRIEF DESCRIPTION OF THE DRAWING

The FIGURE shows the apparatus used for metallizing the surfaces of the substrates in accordance with the present invention.

DETAILED DESCRIPTION OF THE INVENTION

In general, fine metallic particles in nano scale can be generated within a narrow gap in an electroless electrolyte which contains no stabilizer and is over a certain temperature. For such a narrow gap, heat and mass transfers are not good. Therefore, the fine particles with high activating dangling bonds can be adsorbed on or further chemically bonded to the surface.

An apparatus used for metallizing substrates by Nonhomogeneous Heating Plating is shown in the FIGURE. The substrate 2 is secured in a container and has a presetting distance 3 from a flat board 1 of a heater 5. The electrolyte contained in the container is cooled by a condenser 4. By setting the flat board 1 and the electrolyte at different temperatures, a thin metallic film can be observed in duration. In the present invention, precious metals such as Sn/Pd colloid, are unnecessary and only general cleaning procedures such as degreasing and deoxidization, are required. Coarsening the surfaces can be optionally applied.

Compositions of the electrolytes for Ni and Cu plating are listed in Table 1 and 2, respectively.

TABLE 1

| Components | Concentration |
| --- | --- |
| $NiSO_4$ | 0.25 M |
| Sodium Phosphite | 0.05 M |
| Sodium Lactate | 0.21 M |
| pH (adjust by $NH_4OH$) | 5 |

TABLE 2

| Components | Concentration |
| --- | --- |
| $CuSO_4$ | 0.03 M |
| Glyoxylate | 0.20 M |
| EDTA | 0.24 M |
| pH (adjust by NaOH) | 12.5 |

Comparative Example 1

Conventional chemical plating with Ni is used for metallizing an N-Type (110) Si substrate. Procedures and operation conditions are as follows:

| Procedures | Treatment Solution | Operation Temperature | Operation Time |
| --- | --- | --- | --- |
| Degreasing (I) | Acetone | RT | 20 sec. |
| Degreasing (II) | Isopropanol | RT | 20 sec. |
| Washing | DI Water | RT | 20 sec. |
| Removing Organic Matters | $H_2SO_4/H_2O_2/H_2O$ (200/50/750) | RT | 120 sec. |
| Washing | DI Water | RT | 20 sec. |
| Removing Oxides | $HF/H_2O$ (10/990) | RT | 90 sec. |
| Washing | DI Water | | |
| Coarsening | $NH_4HF_2/HF/H_2O$ (100/20/880) | RT | 10 min. |
| Washing | DI Water | RT | 60 sec. |
| Plating | As Table 1 | 88° C. | 10 min. |
| Washing | DI Water | RT | 20 sec. |
| Drying | Nitrogen | | 60 sec. |

DI water: deionized water
RT: room temperature

In Comparative Example 1, the procedures are Complex and the Ni film plated is not firmly adhered on the substrate when tested with a No. 250 tape of 3M™ Company. Additionally, some Ni films are deposited on the bottom of the container because the electrolyte is not stable enough and spontaneously destroyed after 20 minutes unless a stabilizer is added.

Comparative Example 2

Conventional chemical (electroless) plating with Ni is used for metallizing an $Al_2O_3$ substrate. Procedures and operation conditions are as follows:

| Procedures | Treatment Solution | Operation Temperature | Operation Time |
| --- | --- | --- | --- |
| Degreasing | Isopropanol | RT | 20 sec. |
| Washing | DI Water | RT | 20 sec. |
| Removing Organic Matters | $H_2SO_4/H_2O_2/H_2O$ (200/50/750) | RT | 120 sec. |
| Washing | DI Water | RT | 20 sec. |
| Removing Oxides | $HF/H_2O$ (10/990) | RT | 90 sec. |
| Washing | DI Water | | |
| Coarsening | $NH_4HF_2/HF/H_2O$ (100/20/880) | RT | 10 min. |
| Washing | DI Water | RT | 60 sec. |
| Neutralization | $NH_4OH/H_2O$ (10/100) | RT | 60 sec. |
| Washing | DI Water | RT | 60 sec. |
| Activation | Rockwood C-437 60 ml/L, HCl 40 ml/L | 40° C. | 15 min. |
| Washing | DI Water | RT | 60 sec. |
| Removing Tin Shell | $HCl/H_2O$ (100/900) | RT | 60 sec. |
| Washing | DI Water | RT | 60 sec. |
| Plating | As Table 1 | 88° C. | 10 min. |
| Washing | DI Water | RT | 20 sec. |
| Drying | Nitrogen | | 60 sec. |

Rockwood C-437: Sn/Pd colloid solutions of Rockwood Electrochemical Materials Co..

In Comparative Example 2, the procedures are complex and the plating Ni film is not firmly adhered on the substrate, even though a precious metal is added for activation.

Comparative Example 3

Conventional chemical plating with Ni is used for metallizing an $Al_2O_3$ substrate. Procedures and operation conditions are as follow:

| Procedures | Treatment Solution | Operation Temperature | Operation Time |
| --- | --- | --- | --- |
| Degreasing | Isopropanol | RT | 20 sec. |
| Washing | DI Water | RT | 20 sec. |
| Removing Organic Matters | $H_2SO_4/H_2O_2/H_2O$ (200/50/750) | RT | 120 sec. |
| Washing | DI Water | RT | 20 sec. |
| Coarsening | $NH_4HF_2/HF/H_2O$ (100/20/880) | RT | 10 min. |
| Washing | DI Water | RT | 60 sec. |
| Plating | As Table 1 | 88° C. | 10 min. |
| Washing | DI Water | RT | 20 sec. |
| Drying | Nitrogen | | 10 sec. |

In Comparative Example 3, no Ni film is formed on the substrate without adding Sn/Pd colloid solutions. Likewise, the electrolyte is not stable enough and spontaneously destroyed.

EXAMPLE 1

Nonhomogeneous heating chemical plating with Ni in accordance with the present invention is used for metallizing a Si substrate. Procedures and operation conditions are as follows:

| Procedures | Treatment Solution | Operation Temperature | Operation Time | Distance of the Gap |
| --- | --- | --- | --- | --- |
| Degreasing | Isopropanol | RT | 20 sec. | |
| Washing | DI Water | RT | 20 sec. | |

-continued

| Procedures | Treatment Solution | Operation Temperature | Operation Time | Distance of the Gap |
|---|---|---|---|---|
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |
| Washing | DI Water | RT | 60 sec. | |
| Plating | As Table 1 | Ts: 100° C. Tb: 40° C. | 10 min. | 300 μm |
| Washing | DI Water | RT | 20 sec. | |
| Drying | Nitrogen | | 10 sec. | |

Ts: temperature of the flat board attached to the heater
Tb: temperature of the electrolyte In Example 1, the test results indicate that the plating Ni film can be firmly adhered on the substrate without the activation procedure. The electrolyte is stable and no Ni film is deposited on the bottom of the container.

EXAMPLE 2

Nonhomogeneous chemical plating with Cu in accordance with the present invention is used for metallizing a Si substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |
| Washing | DI Water | RT | 60 sec. | |
| Plating | As Table 2 | Ts: 100° C. Tb: 20° C. | 10 min. | 300 μm |
| Washing | DI Water | RT | 20 sec. | |
| Drying | Nitrogen | | 10 sec. | |

In Example 1, test results indicate that the plating Cu film is firmly adhered on the substrate without the need of dipping in Sn/Pd colloid solutions. The electrolyte is stable and no Ni film is deposited on the bottom and wall of the reactor.

EXAMPLE 3

Nonhomogeneous chemical plating with Ni in accordance with the present invention is used for metallizing an $Al_2O_3$ substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |

-continued

| Procedures | Treatment Solution | Operation Temperature | Operation Time | Distance of the Gap |
|---|---|---|---|---|
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |
| Washing | DI Water | RT | 60 sec. | |
| Plating | As Table 1 | Ts: 100° C. Tb: 40° C. | 10 min. | 250 μm |
| Washing | DI Water | RT | 20 sec. | |
| Drying | Nitrogen | | 10 sec. | |

In Example 3, test results indicate that the plating Ni film is firmly adhered on the substrate without the need of dipping in Sn/Pd colloid solutions. The electrolyte is stable and no Ni film is deposited on the bottom and wall of the reactor.

EXAMPLE 4

Nonhomogeneous chemical plating with Cu in accordance with the present invention is used for an $Al_2O_3$ substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |
| Washing | DI Water | RT | 60 sec. | |
| Plating | As Table 2 | Ts: 100° C. Tb: 20° C. | 10 min. | 250 μm |
| Washing | DI Water | RT | 20 sec. | |
| Drying | Nitrogen | | 10 sec. | |

In Example 4, test results indicate that the plating Cu film is firmly adhered on the substrate without the need of dipping in Sn/Pd colloid solutions. The electrolyte is stable and no Ni film is deposited on the bottom and wall of the container.

EXAMPLE 5

Nonhomogeneous chemical plating with Ni in accordance with the present invention is used for an $Al_2O_3$ substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |
| Removing Organic Matters | $H_2SO_4/H_2O_2/H_2O$ (200/50/750) | RT | 120 sec. | |

-continued

| Procedures | Treatment Solution | Operation Temperature | Operation Time | Distance of the Gap |
|---|---|---|---|---|
| Washing | DI Water | RT | 20 sec. | |
| Plating | As Table 1 | Ts: 100° C. Tb: 40° C. | 10 min. | 250 μm |
| Washing | DI Water | RT | 20 sec. | |
| Drying | Nitrogen | | 10 sec. | |

In Example 5, test results indicate that the plating Ni film is firmly adhered on the substrate without adding Sn/Pd colloid solutions. The electrolyte is stable and no Ni film is deposited on the bottom and wall of the reactor.

EXAMPLE 6

Nonhomogeneous chemical plating with Ni in accordance with the present invention is used for a Si substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |
| Washing | DI Water | RT | 60 sec. | |
| Plating | As Table 1 | Ts: 100° C. Tb: 40° C. | 5 min. | 200 μm |
| Washing | DI Water | RT | 20 sec. | |
| Drying | Nitrogen | | 10 sec. | |

In Example 6, test results indicate that the plating Ni film is firmly adhered on the substrate without the need of dipping in Sn/Pd colloid solutions. The electrolyte is stable and no Ni film is deposited on the bottom and wall of the reactor.

EXAMPLE 7

Nonhomogeneous chemical plating with Cu in accordance with the present invention is used for a Si substrate. Procedures and operation conditions are as follows:

| Procedures | Treatment Solution | Operation Temperature | Operation Time | Distance of the Gap |
|---|---|---|---|---|
| Degreasing | Isopropanol | RT | 20 sec. | |
| Washing | DI Water | RT | 20 sec. | |
| Removing Organic Matters | $H_2SO_4/H_2O_2/H_2O$ (200/50/750) | RT | 120 sec. | |
| Washing | DI Water | RT | 20 sec. | |
| Coarsening | $NH_4HF_2/HF/H_2O$ (100/20/880) | RT | 10 min. | |

-continued

| Procedures | Treatment Solution | Operation Temperature | Operation Time | Distance of the Gap |
|---|---|---|---|---|
| Washing | DI Water | RT | 60 sec. | |
| Plating | As Table 2 | Ts: 100° C. Tb: 20° C. | 3 min. | 300 μm |
| Washing | DI Water | RT | 20 sec. | |
| Drying | Nitrogen | | 10 sec. | |

In Example 7, test results indicate that the plating Cu film is firmly adhered on the substrate without the need of dipping in Sn/Pd colloid solutions. The electrolyte is stable and no Ni film is deposited on the bottom and wall of the reactor.

The test results of Comparative Examples 1–3 and Examples 1–7 are further summarized in Table 3.

TABLE 3

| Comparative Examples and Examples | Adhesion of Plated Film | Stability of Electrolyte |
|---|---|---|
| Comparative Example 1 | Not Good | Not Good |
| Comparative Example 2 | Not Good | Not Good |
| Comparative Example 3 | No Film | Not Good |
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |

As shown in Table 3, even though activating precious metal is added, the films formed by conventional chemical plating perform worse adhesion than the nonhomogeneous heating plating with proper gaps between the heater and the substrates. Furthermore, the electrolytes still exhibit good stability without the adding of a stabilizer.

From the foregoing description, one skilled in the art can easily ascertain the essential characteristics of this invention, and without departing from the scope thereof, can make various changes and modifications of the invention to adapt it to various usages and conditions. Thus, other embodiments are also within the claims.

What is claimed is:

1. A method for metallizing a surface of a substrate, comprising steps of:
   a) pre-treating said surface of said substrate;
   b) positioning said substrate in an electroless plating reactor in which a heat source and an electrolyte are set at different temperatures, said substrate and said heat source forming a gap of 0.1 to 1000 μm; and
   c) metallizing said substrate for a presetting duration.

2. The method as claimed in claim 1, wherein said electrolye contains ions selected from the group consisting of Fe, Co, Ni, Cu, Ag, Au, Sn, Pt and Pd.

3. The method as claimed in claim 1, wherein said electrolyte is controlled at pH 3–13.

4. The method as claimed in claim 1, wherein said electrolyte contains $Ni^{2+}$.

5. The method as claimed in claim 4, wherein said electrolyte is controlled at pH 4–9.

6. The method as claimed in claim 1, wherein said electrolyte contains $cu^{2+}$.

7. The method as claimed in claim 6, wherein said electrolyte is controlled at pH 12–13.

8. The method as claimed in claim 1, wherein said substrate is pre-treated by at least one procedure selected from the procedures consisting of swelling, degreasing, coarsening, activation and washing.

9. The method as claimed in claim 1, wherein said gap is between 30 $\mu$m and 500 $\mu$m.

10. The method as claimed in claim 1, wherein said heat source is controlled at 50–200° C.

11. The method as claimed in claim 1, wherein said heat source is controlled at 70–150° C.

12. The method as claimed in claim 1, wherein said electrolyte is controlled at 10–80° C.

13. The method as claimed in claim 1, wherein said electrolyte is controlled at 10–50° C.

14. The method as claimed in claim 1, wherein said heat source and said electrolyte have a temperature difference ranging from 20° C. to 120° C.

15. The method as claimed in claim 1, wherein said heat source and said electrolyte have a temperature difference ranging from 40° C. to 100° C.

16. The method as claimed in claim 1, wherein said presetting duration is 10 seconds–120 minutes for metallizing said substrate.

17. The method as claimed in claim 1, wherein said presetting duration is 1–90 minutes for metallizing said substrate.

18. The method as claimed in claim 1, wherein said substrate is above said heat source.

19. The method as claimed in claim 15, wherein the gap is between 30 $\mu$m and 500 $\mu$m.

20. The method according to claim 19, wherein the gap is between 200–300 $\mu$m.

* * * * *